United States Patent
Sorin et al.

(10) Patent No.: US 10,193,632 B2
(45) Date of Patent: Jan. 29, 2019

(54) OPTICAL DEVICES INCLUDING A HIGH CONTRAST GRATING LENS

(71) Applicant: Hewlett-Packard Development Company, L.P., Houston, TX (US)

(72) Inventors: Wayne Victor Sorin, Mountain View, CA (US); Michael Renne Ty Tan, Menlo Park, CA (US); David A. Fattal, Mountain View, CA (US); Sagi Varghese Mathai, Sunnyvale, CA (US)

(73) Assignee: Hewlett Packard Enterprise Development LP, Houston, TX (US)

( * ) Notice: Subject to any disclaimer, the term of this patent is extended or adjusted under 35 U.S.C. 154(b) by 0 days.

(21) Appl. No.: 14/941,779

(22) PCT Filed: May 22, 2013

(86) PCT No.: PCT/US2013/042261
§ 371 (c)(1),
(2) Date: Nov. 16, 2015

(87) PCT Pub. No.: WO2014/189507
PCT Pub. Date: Nov. 27, 2014

(65) Prior Publication Data
US 2016/0149646 A1 May 26, 2016

(51) Int. Cl.
*G02B 6/34* (2006.01)
*G02B 6/32* (2006.01)
(Continued)

(52) U.S. Cl.
CPC ......... *H04B 10/503* (2013.01); *G02B 5/1809* (2013.01); *G02B 5/1842* (2013.01);
(Continued)

(58) Field of Classification Search
CPC ...... H01S 5/423; H01S 5/005; H01S 5/02284; H01S 5/141; H01S 5/4068; H04B 10/071;
(Continued)

(56) References Cited

U.S. PATENT DOCUMENTS 5,285,466 A 2/1994 Tabatabaie
5,428,635 A 6/1995 Zhiglinsky et al.
(Continued)

FOREIGN PATENT DOCUMENTS

KR 20010003111 A 1/2001
WO WO 2011093884 A1 8/2011
(Continued)

OTHER PUBLICATIONS

Chevallier, C. et al., "Optimized Si/SiO2 high contrast grating mirror design for mid-infrared wavelength range: robustness enhancement," (Research Paper), Nov. 18, 2011, pp. 1-13, available at http://arxiv.org/pdf/1111.4101.pdf.
(Continued)

*Primary Examiner* — Kaveh C Kianni
*Assistant Examiner* — Hung Lam
(74) *Attorney, Agent, or Firm* — Hewlett Packard Enterprise Patent Department

(57) ABSTRACT

Techniques related to optical devices including a high contrast grating (HCG) lens are described herein. In an example, an optical device includes a transparent substrate. A laser emitter or detector at a first side of the transparent substrate to emit or detect a laser light transmitted via the transparent substrate. A HCG lens is at a second side of the transparent substrate to transmit and refract the laser light.

17 Claims, 9 Drawing Sheets

(51) Int. Cl.

| | | |
|---|---|---|
| *G02B 6/26* | (2006.01) | |
| *G02B 6/30* | (2006.01) | |
| *G02B 6/36* | (2006.01) | |
| *H04B 10/50* | (2013.01) | |
| *G02B 5/18* | (2006.01) | |
| *G02B 6/42* | (2006.01) | |
| *H01S 5/00* | (2006.01) | |
| *H01S 5/183* | (2006.01) | |

(52) U.S. Cl.
CPC ............... *G02B 6/32* (2013.01); *G02B 6/34* (2013.01); *G02B 6/4206* (2013.01); *H01S 5/005* (2013.01); *H01S 5/183* (2013.01)

(58) Field of Classification Search
CPC ...... H04B 10/40; H04B 10/60; H04B 10/801; H04B 10/802; H04B 10/2581; H04B 10/671; H04B 10/50
USPC ...... 385/31, 33–35, 88–93; 359/15, 19, 558, 359/565
See application file for complete search history.

(56) References Cited

U.S. PATENT DOCUMENTS

| | | |
|---|---|---|
| 6,829,286 B1 | 12/2004 | Guilfoyle et al. |
| 6,856,460 B2 | 2/2005 | Coleman et al. |
| 7,194,016 B2 | 3/2007 | Bullington et al. |
| 8,059,690 B2 | 11/2011 | Chang-Hasnain et al. |
| 8,189,643 B2 | 5/2012 | Chang-Hasnain et al. |
| 8,340,483 B2 | 12/2012 | Lee et al. |
| 8,488,646 B2 | 7/2013 | Chang-Hasnain et al. |
| 8,526,471 B2 | 9/2013 | Chang-Hasnain et al. |
| 8,861,060 B2 | 10/2014 | Puegner et al. |
| 9,065,239 B2 | 6/2015 | Joseph et al. |
| 9,530,905 B2 * | 12/2016 | Wang ................ H01L 31/02363 |
| 2002/0076128 A1 | 6/2002 | LoCascio et al. |
| 2003/0117681 A1 | 6/2003 | Tayebati |
| 2004/0136074 A1 | 7/2004 | Ford et al. |
| 2008/0055698 A1 | 3/2008 | Yurlov et al. |
| 2011/0280269 A1 | 11/2011 | Chang-Hasnain et al. |
| 2012/0027350 A1 | 2/2012 | Fu et al. |
| 2012/0128019 A1 | 5/2012 | Chang-Hasnain et al. |
| 2012/0281950 A1 | 11/2012 | Fattal et al. |
| 2013/0028279 A1 | 1/2013 | Iakovlev et al. |
| 2013/0051410 A1 | 2/2013 | Chang-Hasnain et al. |
| 2013/0051419 A1 | 2/2013 | Chang-Hasnain et al. |
| 2013/0058370 A1 | 3/2013 | Chang-Hasnain et al. |
| 2013/0209110 A1 | 8/2013 | Fattal et al. |
| 2015/0010271 A1 * | 1/2015 | Fattal ........................ G02B 6/34 385/14 |
| 2015/0160384 A1 | 6/2015 | Arbabi et al. |

FOREIGN PATENT DOCUMENTS

| | | |
|---|---|---|
| WO | WO 2011093895 A1 | 8/2011 |
| WO | WO-2011136759 A1 | 11/2011 |
| WO | WO-2012144997 A1 | 10/2012 |
| WO | WO 2012144997 A1 | 10/2012 |
| WO | WO-2012149497 A2 | 11/2012 |
| WO | WO-2012155911 A1 | 11/2012 |
| WO | WO-2013085535 A1 | 6/2013 |
| WO | WO-2013105959 A1 | 7/2013 |
| WO | WO-2014189507 | 11/2014 |
| WO | WO-2014204468 | 12/2014 |

OTHER PUBLICATIONS

Fattal, D. et al. "'A Silicon Lens for Integrated Free-Space Optics," Integrated Photonics Research, Silicon and Nanophotonics, Optical Society of America, 2011, 4 pages.

International Search Report & Written Opinion received in PCT Application No. PCT/US2013/042261, dated Feb. 26, 2014, 11 pages.

Lin, C-K et al., "High-Speed 985 nm Bottom-Emitting VCSEL Arrays for Chip-to-Chip Parallel Optical Interconnects," Selected Topics in Quantum Electronics, IEEE Journal of 13.5, 2007, pp. 1332-1339.

Extended European Search Report dated Nov. 28, 2016 for EP Application No. 13885204.1; pp. 9.

Fanglu Lu et al: "Planar high-numerical—aperture low-loss focusing reflectors and lenses using subwavelength high contrast gratings", Optics Express, vol. 18, No. 12, Jun. 7, 2010 (Jun. 7, 2010) pp. 12606 1347 XP05516288 DOI: 10 1364/OE.

Ansbaek, T. et al., "1060-nm Tunable Monolithic High Index Contrast Subwavelength Grating VCSEL," (Research Paper), Photonics Technology Letters, IEEE 25.4, Feb. 15, 2013, pp. 365-367.

Ansbaek, T., Vertical-cavity Surface-emitting Lasers for Medical Diagnosis, (Research Paper), Sep. 30, 2012.

Bisaillon, E. et al., Resonant Grating Based Fabry-Perot Cavity in AlGaAs/GaAs, (Research Paper), Jul. 6, 2006.

Extended European Search Report dated May 15, 2017 for EP application No. 13896275.8; p. 10.

F. Lu, et al; "Planar high-numerical-aperture low-loss focusing reflectors and lenses using subwavelength high contrast gratings," Opt. Express, vol. 16, No. 12, pp. 12606-12614, (2010).

Fattal, D. et al., "Flat Dielectric Grating Reflectors with Focusing Abilities," (Research Paper), Nature Photonics 4.7, May 2, 2010, pp. 466-470.

International Search Report & Written Opinion received in PCT Application No. PCT/US2013/067342, Jul. 24. 2014, 12 pages.

Karagodsky, Matrix Fabry—Perot resonance mechanism in high-contrast gratings, (Web Page), May 1, 2011. http://wmv.opticsinfobase.org/ol/abstract.cfm?uri=ol-36-9-1704.

Weijian Yang et al., "High Speed, Ultra-compact Spectrometer Using High Contrast Grating Swept-wavelength Detector," 2013 IEEE Avionics, Fiber-Optics and Photonics Conference (AVFOP), Oct. 1-3, 2013, pp. 86-87.

Mathani, S. V., et al; "Notice of Allowance and Fee(s) Due"; cited in U.S. Appl. No. 15/106,850 dated Jun. 6, 2018; 13 pages.

* cited by examiner

OPTICAL DEVICES INCLUDING A HIGH CONTRAST GRATING LENS

BACKGROUND

Many applications depend on sending and receiving relatively large amounts of data. Technologies based on transmitting data using light are a convenient option that offers high network bandwidth. (Transmitting data using light is hereinafter referred to as optical communication.) There are a number of devices that use light for transmitting information. For example, optical fibers are capable of transmitting data over vast distances providing high network bandwidth. Photonic integrated circuits (PIC) are another example, in which multiple photonic functions are integrated for providing functionality for light signals.

Some systems for optical communication are based on emission and detection of modulated laser light acting as data carrier. In particular, semiconductor devices for laser emission and detection are now commonplace in optical communication systems. For example, vertical-cavity surface emitting lasers (VCSELs) may be used for laser emission. Laser detector semiconductor photodiodes may be used for laser detection. An optical waveguide (e.g., an optical fiber) may be used for transmitting the laser light between laser emitters and detectors.

BRIEF DESCRIPTION OF THE DRAWINGS

In order that the present disclosure may be well understood, various examples will now be described with reference to the following drawings.

DETAILED DESCRIPTION

Figure 1:
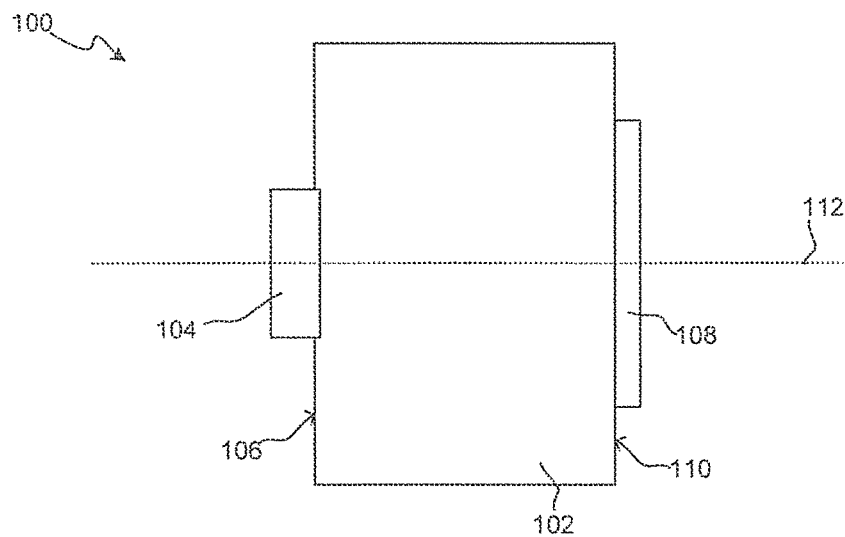
FIG. 1 is a schematic representation of an optical device according to examples herein.

In the following description, numerous details are set forth to provide an understanding of the examples disclosed herein. However, it will be understood that the examples may be practiced without these details. While a limited number of examples have been disclosed, it should be understood that there are numerous modifications and variations therefrom. Similar or equal elements in the Figures may be indicated using the same numeral.

As set forth above, semiconductor devices for laser emission and detection are now commonplace in optical communication systems. Some prominent examples are vertical-cavity surface emitting lasers (VCSELs) and semiconductor based photodiodes, e.g. PN or PIN diodes.

Such laser emitters/detectors, e.g. VCSELs or semiconductor photodiodes, are presently an object of industrial mass production. Some applications of such laser emitters/detectors are in optical interconnects, for example, in single channel Gigabit Ethernet or parallel transceiver modules based on multimode fiber ribbons.

Generally, in order to implement optical communications, the laser emitting/detecting devices are optically coupled to an optical waveguide (e.g., an optical fiber). At least some solutions that are used for optically coupling the laser emitting/detecting devices with external devices (e.g., a waveguide) may require the use of external lenses. However, coupling via external lenses may be cumbersome. For example, lenses may require precision alignment via high-precision positioning devices. Further, after alignment, lenses may further require to be securely attached to the substrate of the laser emitting/detecting device to provide stable coupling. However, separate lens elements and precision alignment processes may substantially increase manufacturing costs and negatively impact system compactness.

It has also been proposed elsewhere to integrate bottom-emitting VCSELs (i.e., VCSELs configured to emit light towards the substrate onto which they are built on) with integrated backside lenses. Thereby, it is intended to implement chip-scale interconnection on VCSEL arrays. However, the process for generating the curved surface of backside, refractive lenses may be difficult and may substantially increase manufacturing costs.

In at least some of the examples disclosed herein, use of a HCG lens at a side of the transparent substrate to transmit and refract laser light as set forth in at least some of the examples herein facilitates a cost-effective and precise optical coupling of a laser emitter or detector with other devices via a high-contrast grating (HCG) lens. The HCG lens and the laser emitter, or detector, are at a common substrate.

As used herein, a laser emitter is any device suitable to emit laser light and being provided at a common substrate with a HCG lens. A VCSEL is an example of such a laser emitter. As used herein, a laser detector is any device suitable to sense laser light and being provided at a common substrate with a HCG lens. A semiconductor diode, e.g. a PN or PIN diode configured to sense light (by being reversed biased) is an example of such a laser detector.

As used herein, a HCG lens refers to an optical element which transmits and refracts a beam of light, converging or diverging the beam, via a high-contrast grating, i.e. a grating with a pitch that is sufficiently small to suppress all but the 0th order diffraction for the light with which the optical device is designed to operate. The degree of beam convergence or divergence depends on the pitch and configuration of the grating. The grating forms a so-called high-contrast grating (HCG).

HCG lenses may be easily fabricated using convenient micro-fabrication procedures and high volume production methods. For example, HCG lenses may be manufactured by lithography methods with manufacturing tolerances that may be below one micron. Examples of lithography methods include standard CMOS processes or roll-to-roll imprinting. Hence, coupling a laser emitter/detector using a HCG lens facilitates cost-effective manufacturing. In particular, HCG lenses may be manufactured at a lower price than conventional lenses without compromising precision in the achieved optical alignment.

In the following description, the term "light" refers to electromagnetic radiation with wavelength(s) in the visible and non-visible portions of the electromagnetic spectrum, including infrared and ultra-violet portions of the electromagnetic spectrum. The term "laser light" refers to light emitted via optical amplification based on the stimulated emission of electromagnetic radiation. It will be understood that when a layer or film is referred to or shown as being "between" two layers or films, it can be the only layer or film between the two layers or films, or one or more intervening layers or films may also be present.

OPTICAL DEVICES: FIG. 1 shows an optical device 100. Device 100 includes a transparent substrate 102. A laser emitter/detector 104 is at a first side 106 of transparent substrate 102. Device 104 is to emit or detect laser light transmitted via transparent substrate 102.

A HCG lens 108 is at a second side 110 of transparent substrate 102. HCG lens 108 is to receive the laser light from transparent substrate 102 (if device 104 is being operated as a laser emitter) or couple the laser light from transparent substrate 102 (if device 104 is being operated as a laser sensor). Thereby, HCG lens 108 defines an optical path 112 (i.e., the path that light takes in traversing the optical system). Optical path 112 may be configured for optically coupling device 104 with an external optical device (not shown). For example, as illustrated in more detail below with respect to FIGS. 2 to 4, device 104 may be coupled with an external waveguide or to another type of device for optical communication.

Transparent substrate 102 may include material that allows transmission therethrough of laser light emitted or received by laser emitter/detector 104. The material of substrate 102 may be chosen to facilitate integration of laser emitter/detector 104 and HCG lens 108 thereon. For example, substrate 102 may include a transparent semiconductor material with a high refractive index such as a refractive index of between 2 and 4 such as 3.5. Such a material for substrate 102 may be, for example, GaAs, Si, InGaAs, InP or a combination thereof.

It will be understood that transparent substrate 102 may partially absorb the laser light transmitted toward, or received by, laser emitter/detector 104. In the illustrated example of FIG. 1, first and second sides 106, 110 of substrate 102 are parallel and opposite to each other. Other configurations of first and second sides 106, 110 of substrate 102 are foreseen (e.g., an oblique configuration).

Figure 2A:
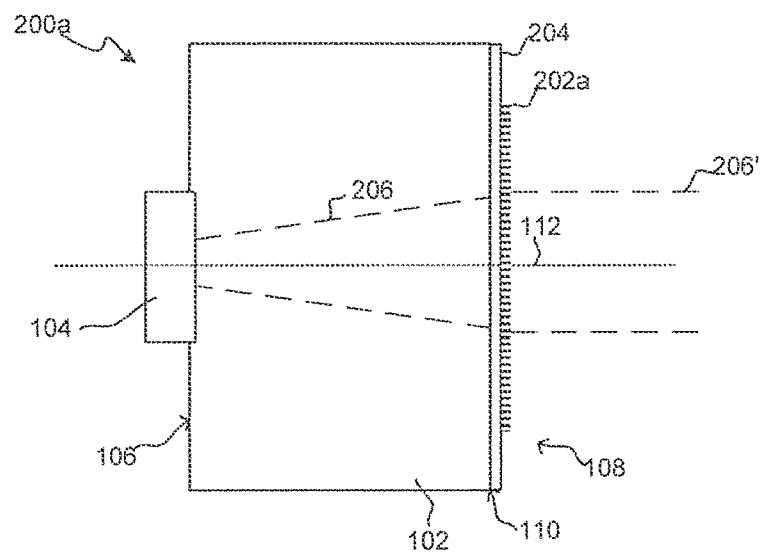
FIGS. 2A and 2B are schematic representations of optical devices in operation according to examples.
Figure 2B:
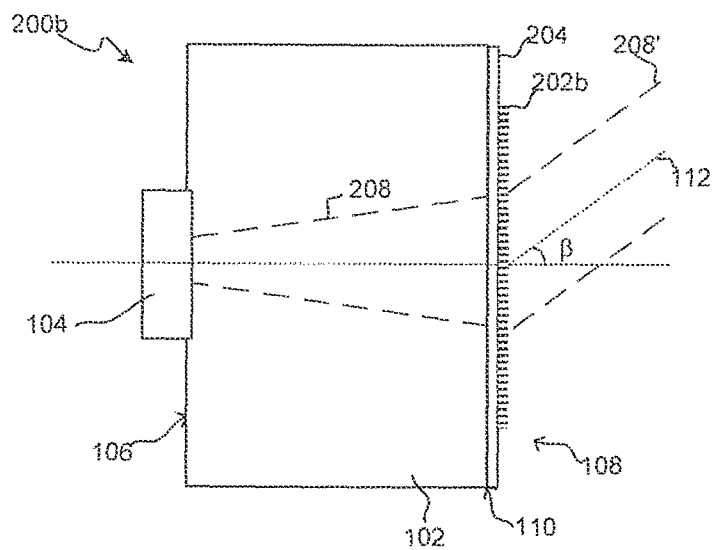

FIGS. 2A and 2B illustrate different examples of optical devices 200a-200b in operation. Optical devices 200a-200b are configured similarly to optical device 100 of FIG. 1. In these Figures specific examples of HCG lens 108 are illustrated which include a high contrast grating (HCG) layer 202a, 202b and a separation layer 204. A HCG layer, as used herein, refers to a grating layer with a grating pitch that is sufficiently small to suppress all but the 0th order diffraction. The structure of HCG layers 202a, 202b determines how HCG lens 108 transmits and refracts light (e.g., whether it collimates a diverging laser beam impinging thereon). Examples on how the HCG layer can be constituted are illustrated below in the Section titled "CONFIGURING SUB-WAVELENGTH GRATINGS".

Separation layer 204 may include a low refractive index material built onto substrate 102 such as, but not limited to $SiO_2$. The low refractive index may be an index between 1.3 and 2.0 such as 1.46. Such a material for separation layer 204 may be, for example, $SiO_2$, $Si_3N_4$ (silicon nitride), glasses, polymers or a combination thereof. In general, separation layer 204 may be constituted in a manner such that it enhances resonant optical effects that HCG layers 202a, 202b cause on laser light impinging thereon. More specifically, resonant optical effects might be enhanced by providing via separation layer 204 a refractive index difference between HCG layer 202a, 202b (e.g. posts) and substrate 102. For example, substrate 104 and HCG layer 202a, 202b may be made of the same material (e.g., a material with a refractive index of 3.5); in this example separation layer 204 may be made of a material with a different refractive index (e.g. 1.46) to provide a differential refractive index enhancing resonances.

According to some examples, HCG lens 108 is to collimate a divergent laser light. More specifically, the grating elements at HCG layer 202a may be configured such that a divergent laser beam being transmitted along optical path 112 is collimated along the same direction. In FIG. 2A, optical device 200a illustrates such an example. In this example, laser emitter/detector 104 is for emitting a divergent laser beam 206 (for example, laser emitter/detector 104 may be a VCSEL). Optical device 200a, and in particular HCG lens 108, is configured to collimate divergent laser beam 206 into a collimated laser beam 206'.

According to some examples, HCG lens 108 is to focus a laser light. For example, referring again to FIG. 2A, it will be understood that HCG lens 108 may be configured to function in a reciprocal manner. Namely, laser emitter/detector 104 may be configured as a sensor and HCG lens 108 may be then configured to focus collimated laser beam 206' (in this case a laser beam propagating towards optical device 200a). Thereby, a divergent laser beam 206 can be directed towards device 104, configured as a detector, for sensing the laser light.

According to some examples, HCG lens 108 is to tilt a laser light. More specifically, referring now to FIG. 2B, the grating elements at HCG layer 202b may be configured such that it changes the direction onto which a laser beam (e.g., laser beams 208 or 208') propagates. In other words, in this example, HCG layer 202b is constituted such that optical path 112 introduces a change in the propagation angle β of laser beams 208, 208'. In this example, laser emitter/detector 104 may be for emitting a divergent laser beam 208 (for example, laser emitter/detector 104 may be configured as a VCSEL). Optical device 200b may be then configured to collimate and tilt divergent laser beam 208 into a collimated laser beam 208' propagating with an angle β with respect to the main optical axis of optical device 200b.

FIGS. 2A and 2B illustrate two specific examples on how a HCG lens can transmit and refract laser light. Other examples are foreseen. For example, a HCG lens may be configured to deflect an incident laser so as to change its travel direction, to split it into spectral components, or to filter specific spectral components of an incident wavefront. Furthermore, multiple HCG layers may be stacked onto substrate 102 to provide further functionalities in the transmission and refraction of laser light emitted from, or to be sensed by, laser emitter/detector 104. In particular, HCG lens 108 may be constituted by a plurality of stacked HCG layers arranged to control laser light in a predetermined manner, as illustrated by the international patent application with application number PCT/US2011/064125, which is incorporated herein by reference in its entirety (to the extent in which this document is not inconsistent with the present disclosure) and in particular those parts thereof describing stacking of HCG layers.

Figure 3:
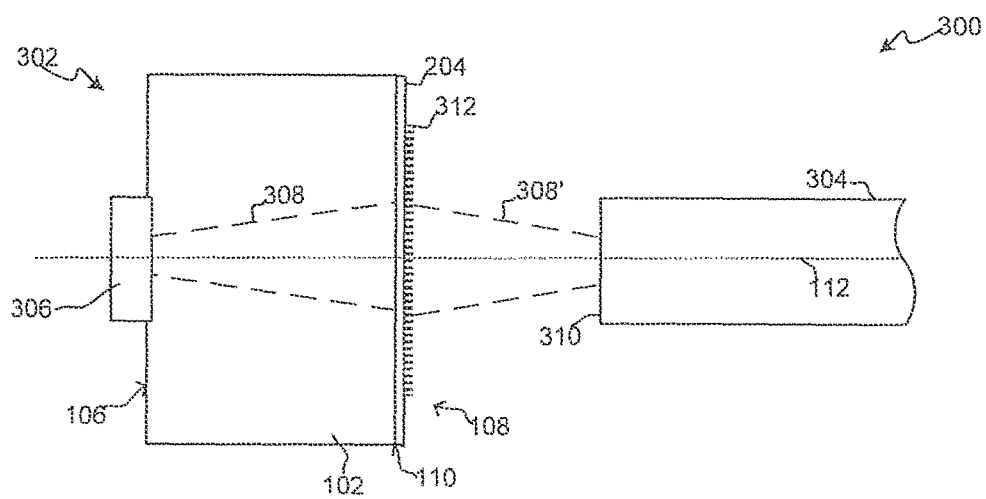
FIG. 3 is a schematic representation of an optical communication device in operation according to examples.

Some examples herein are aimed to optical communication devices. These examples are illustrated in the following with respect to FIG. 3. FIG. 3 illustrates an optical communication device 300. Device 300 includes an optical device 302 and an optical waveguide 304.

In this example, optical device 302 is constituted similarly to optical devices 100, 200a, 200b illustrated above with respect to FIGS. 1 to 2B. In the example shown in FIG. 3, a VCSEL 306 is integrated at first side 106 of transparent substrate 102 to emit a modulated laser light into transparent substrate 102 as a laser beam 308. VCSEL 306 may be connected to a control system (not shown) which is responsible of modulating its output in order to encode information via laser beam 308.

In the example of FIG. 3, HCG lens 108, which is shown including a HCG layer 312 and a separation layer 204, is at a second side 110 of transparent substrate 102. HCG lens 108 is configured to receive laser beam 308 from transparent substrate 102. HCG lens 108 and VCSEL 306 are aligned to each other so that laser light emitted by VCSEL 306 is received by HCG lens 108 via substrate 102. HCG lens 108 is further configured to transmit and refract the modulated laser light into an optical input 310 of optical waveguide 304.

Optical waveguide 304 is any suitable optical element configured to carry a light signal over a certain distance in order to implement optical communications. Optical waveguide 304 may be constituted, for example, by an optical fiber, a dielectric slab waveguide, a strip waveguides, a rib waveguide, or a combination thereof. A dielectric slab waveguide may include three layers of materials with different dielectric constants, the material being chosen such that light is confined in the middle layer by total internal reflection. A strip waveguide may include a strip of a light guiding layer confined between cladding layers. In a rib waveguide, the light guiding layer includes a slab with a strip (or several strips) superimposed onto it.

Optical input 310 is an end of waveguide 304 adapted to receive an incoming laser beam 308'. In the illustrated example, HCG lens 108 is configured to converge laser beam 308, emitted by VCSEL 306, into laser beam 308' so that most or all of the entire laser light is coupled into waveguide 304.

Optical communication device 300 may include further components for aligning the different components to each other such us, among others, housing and clamping elements. (These elements are omitted in the Figures for the sake of simplicity.) Optical communication device 300 may be provided as an integrated system. Waveguide 304 may then include an optical output (not shown) for implementation of the integrated system within an optical communication system.

Laser communication device 302 in FIG. 3 has been illustrated above with respect to laser emission. It will be understood that device 302 can be analogously be configured for laser sensing following the principles set forth above with respect to FIGS. 1 to 2B.

Figure 4:
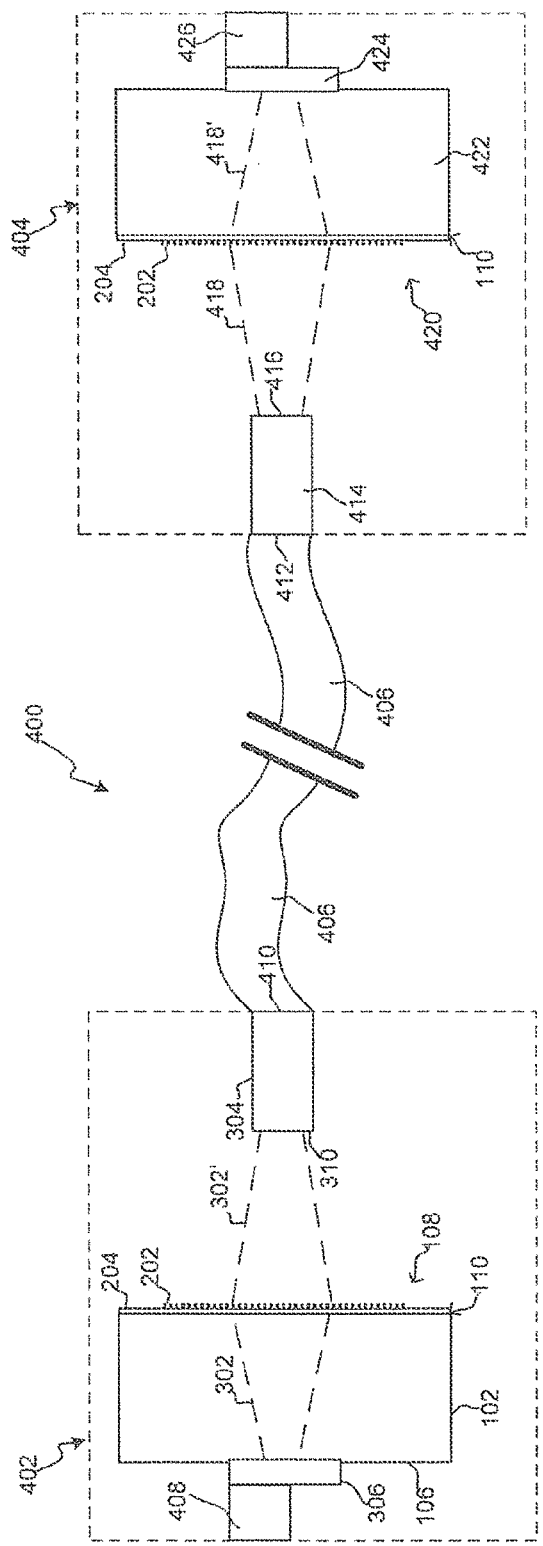
FIG. 4 is a schematic representation of an optical communication system in operation according to examples.

FIG. 4 illustrates an optical communication system 400 including a sender 402 and a receiver 404 according to examples herein. Sender 402 and receiver 404 are intercommunicated via an optical fiber 406. (Optical fiber 406 is shown discontinued to illustrate that it can extend over a relatively large distance.)

Sender 402 and receiver 404 may be constituted similarly to optical devices 100, 200a, 200b illustrated above with respect to FIGS. 1 to 2B. (Analogous elements discussed above are omitted in the following discussion for the sake of conciseness.) Sender 402 is shown including VCSEL 306 for emitting modulated laser light as a beam 302. Sender 402 is shown to include a light modulator 408 that operates VCSEL 306. Light modulator 408 is any structure that controls an input of VCSEL 306 for causing it to optically transmit information. The emitted modulated light is coupled via HCG lens 108 and waveguide 304 into optical fiber 406. More specifically optical fiber 406 is coupled to an optical output 410 of waveguide 304 for receiving laser light emitted by VCSEL 306. In the illustrated example, optical output 410 is an end of waveguide 304.

Optical fiber 406 transmits the modulated light towards receiver 404. More specifically, optical fiber 406 is coupled to an optical input 412 of a waveguide 414 in receiver 404. The modulated light is transmitted via waveguide 414 and emitted at its optical output 416 as a diverging laser beam 418 towards HCG lens 420 of receiver 404. HCG lens 420 converges laser beam 418', which is subsequently transmitted via transparent substrate 422 toward a laser detector 424. Laser detector 424 is operatively coupled to a sensing system 426 that reads and processes sensing output of laser detector 424. Sensing system 426 is any structure that senses currents generated by laser detector 424 and makes them available for further processing, and in particular for decoding data transmitted in the modulated light. Sensing system 426 may include an ammeter for providing a detector signal from a current generated by detector 424 in response to beam 418'.

It will be understood that the system illustrated in FIG. 4 is merely illustrative and that there are a variety of approaches for implementing optical systems according to examples herein for optical communications. In an example, the system of FIG. 4, at sender 402, includes an array of the VCSEL 306 and an array of HCG lens 108 in a corresponding configuration for implementing an array of optical communication channels. Further, the system of FIG. 4, at receiver 404, may include an array of laser detectors and an array of HCG lenses 420 in a corresponding configuration for implementing an array of optical communication channels.

The examples for optical communication described above may include further optical elements for facilitating an efficient transmission of the laser light. For example, additional HCG lenses may be placed at the different optical couplings of the system for guiding the laser light into the different optical components. For example, a HCG lens (not shown) may be placed at optical output 410 of waveguide 304, i.e. before the coupling point in optical fiber 406 for focusing into the optical fiber the laser light transmitted through waveguide 304. Other HCG lenses may be placed at the interfaces of other components (e.g., between optical fiber 406 and waveguide 414) for facilitating light control, e.g. collimation or focusing of laser light into the different components. Additionally, or alternatively thereto, such HCG lenses may implement other control functions such as beam splitting or wavelength separation.

In the optical devices illustrated above, it is mentioned that a laser emitter/detector (e.g., any of devices 104, 306) may be to emit a laser light into the transparent substrate or sense a laser light from the transparent substrate. In a vertical-cavity surface laser diode, laser oscillation and output/input occurs normal to a PN junction plane.

In a laser diode for emission (e.g., VCSEL 306), the laser diode is forward biased by a forward biasing circuit for controlling laser injection so that the laser diode emits light vertically axially to the cavity. This emitted light may be sensed by a suitable sensing system (e.g., sensing system 426) for transducing the received laser light.

Examples of vertical-cavity surface laser diode configurations for laser emission and detection are illustrated in U.S. Pat. No. 5,285,466, which is incorporated herein by reference in its entirety (to the extent in which this document is not inconsistent with the present disclosure) and in particular those parts thereof describing circuitry for operating laser diodes.

Optical communication devices as illustrated herein may form part of a wavelength-division multiplexing (WDM) communication link. In a WDM communication link, a number of optical carrier signals are transmitted via a single optical fiber by using different wavelengths (i.e. colors) of laser light. This technique enables bidirectional communications over one strand of fiber, as well as multiplication of capacity. A system similar to optical communication system 400 is envisaged in which multiple senders and multiple receivers are disposed at respective ends of optical fiber 406. Each sender and receiver is configured for emitting and sending a specific wavelength. An optical multiplexer may be used to join the laser beam data carriers generated by the senders into optical fiber 406. An optical demultiplexer may be used to split the laser beam data carriers carried by optical fiber 406 onto the receivers.

CONFIGURING SUB-WAVELENGTH LENSES: As set forth above, a HCG lens is configured with a HCG layer. In an example, a HCG layer includes a number of one-dimensional grating sub-patterns. Each grating sub-pattern includes a number of regularly arranged resonant structures for causing 0th order diffraction characteristic of the sub-wavelength grating.

A sub-pattern of a HCG layer is characterized by one or more periodic dimensions characteristic of the resonant structure. More specifically, a sub-pattern may include resonant structures (e.g. lines or posts) of width $w_1$ periodically spaced with a period $p_1$; another sub-pattern may include resonant structures with width $w_2$ periodically spaced with a period $p_2$, and another sub-pattern may include resonant structures with width $w_3$ periodically spaced with a period $p_3$.

A grating sub-pattern form an HCG layer if a characteristic dimension thereof (e.g., periods $p_1$, $p_2$, or $p_3$) is smaller than the wavelength of the particular incident light for which it is designed to operate. For example, a characteristic dimension of a HCG (e.g., periods $p_1$, $p_2$, or $p_3$) can range from approximately 10 nm to approximately 300 nm or from approximately 20 nm to approximately 1 µm. Generally, the characteristic dimensions of a HCG are chosen depending on the wavelength of the laser light for which a particular HCG lens is designed to operate (e.g., depending on the laser light to be emitted or received by the optical device in which the HCG lens is integrated).

$0^{th}$ order diffracted light from a sub-region acquires a phase $\varphi$ determined by the line thickness t, and the duty cycle $\eta$, which is defined by:

$$\eta = \frac{w}{p},$$

where w is the line width and p is the period of the lines associated with the region.

Hence, each of the grating sub-patterns differently modifies incident light due to the different duty cycles and periods associated with each of the sub-patterns. Therefore, a HCG layer may be configured to interface incident light in a specific manner by adjusting the period, line width, and line thickness of the lines. Thereby, 0th diffraction may result in laser light refracted after the HCG so as to implement a specific functionality of the HCG lens. This is illustrated in more detail in the following.

Figure 5:
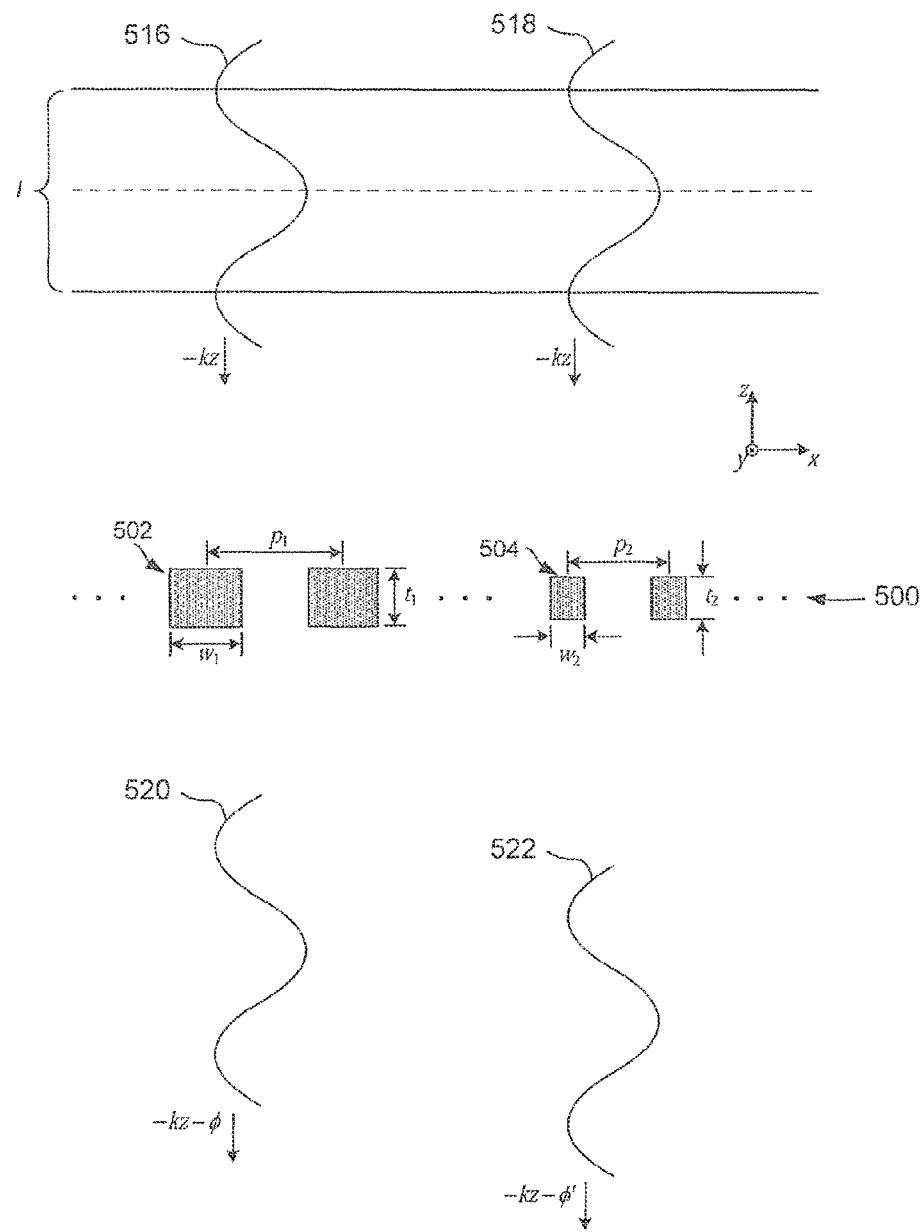
FIG. 5 is a schematic representation of a high contrast grating (HCG) layer according to examples.

FIG. 5 shows a cross-sectional view of a HCG layer 500 according to an example. The Figure depicts portions of two separate grating sub-patterns 502 and 504 of HCG layer 500. The sub-patterns 502 and 504 can be located in different regions of HCG 500. Sub-pattern 502 is characterized by a periodic spacing period $p_1$. Sub-pattern 504 is characterized by a periodic spacing period $p_2$. The thickness $t_1$ of the lines of sub-pattern 502 is greater than the thickness $t_2$ of the lines of sub-pattern 504, and the duty cycle $\eta_1$ associated with the lines in sub-pattern 502 is greater than the duty cycle $\eta_2$ associated with the lines of sub-pattern 504.

FIG. 5 illustrates a HCG layer based on a grating with a non-periodic sub-wavelength pattern. Such HCG layers are characterized by a spatially varying refractive index, which facilitates implementing an arbitrary HCG lens. The basic principle is that light incident on a non-periodical HCG layer may become trapped therein and oscillate for a period of time within portions of the grating. The light is ultimately transmitted through the HCG layer, but with the portion of light transmitted through a sub-region (e.g., sub-region 502) acquiring a larger phase shift than the portion of light transmitted through a sub-region with different characteristic dimensions (e.g., sub-region 504 with respect to sub-region 502).

As shown in the example of FIG. 5, incident wavefront 516 and 518 impinge on HCG 500 with approximately the same phase, but a wavefront 520 is transmitted through sub-pattern 502 with a relatively larger phase shift $\varphi$ than the phase shift $\varphi'$ acquired by a wavefront 522 transmitted through sub-pattern 504. Thereby, transmission and refraction of laser light through the HCG layer can be controlled to determine shaping of the outgoing laser beam (e.g., to collimate, diverge, mode-control, tilt, and/or split the laser beam).

In some examples, a HCG layer may be provided with reflecting layers disposed parallel to the HCG and adjacent to opposite sides thereof. Thereby, resonant cavities may be formed on both sides of the HCG layer. Light may then become trapped on these resonant cavities and become ultimately transmitted through the reflection layers with different phases in the beam similarly as shown in FIG. 5.

A HCG layer may be arranged with so-called polarized resonant elements (hereinafter referred to as polarized HCG lens). In a polarized HCG layer, how light is reflected or transmitted therethrough depends on the specific polarization of incident light. More specifically, elements of the HCG layer may be arranged to be sensitive to polarization of incident light. Specifically, the thickness and pitch of the HCG layer may be chosen to be polarization sensitive as described in the international patent application with publication number WO2011136759, which is incorporated herein by reference to the extent in which this document are not inconsistent with the present disclosure and in particular those parts thereof describing HCG layer design.

Alternatively, a HCG layer may be arranged with so-called unpolarized resonant elements so that how light is reflected or transmitted therethrough does not substantially depend on the specific polarization of incident light. More specifically, elements of the HCG layer may be arranged to be insensitive to polarization of incident light. Such HCG layers are referred to as unpolarized HCG layer. An unpolarized HCG layer is designed by an appropriate selection of the pattern dimensions, using a transmission curve indicative of resonances for particular characteristics dimensions of the HCG, as illustrated in the following with respect to FIGS. 6A to 6C.

Figure 6A:
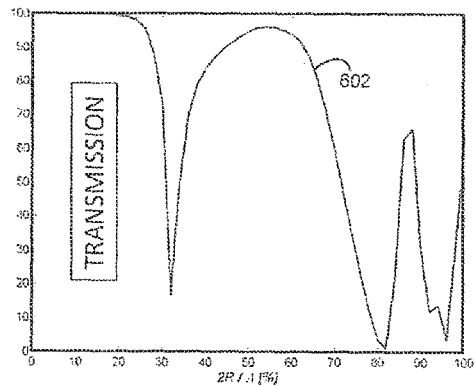
FIGS. 6A and 6B show plots of transmittance and phase shift as a function of duty cycle of a HCG layer according to examples.
Figure 6B:
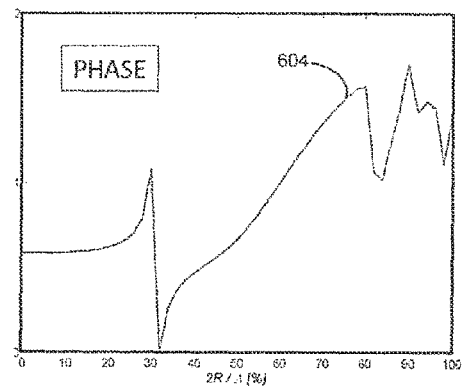
Figure 6C:
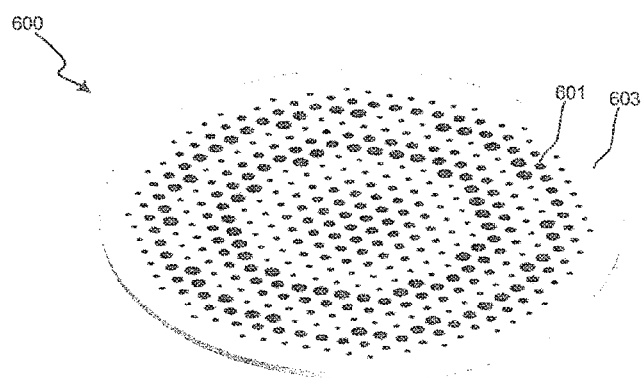
FIG. 6C is a schematic representation of the HCG layer.

FIGS. 6A and 6B show plots of transmittance and phase shift as a function of duty cycle of a HCG layer 600 including posts according to an example herein and illustrated in FIG. 6C. In FIG. 6A, curve 602 corresponds to transmission through HCG layer 600 with a pattern composed of a hexagonal array of silicon posts 601 in an oxide matrix 603 (see FIG. 6C) over a range of duty cycles. (In the graphs of FIGS. 6A, 6C, duty cycle is illustrated as a percent.) In FIG. 6B, curve 604 corresponds to phase of the transmission coefficient for HCG layer 600 over a range of duty cycles. In this example, duty cycles are defined as $2R/\Lambda$, where R is a varying post radius, and $\Lambda$ is a fixed lattice constant. For this specific example, $\Lambda=475$ nm; thickness of posts 601 is kept fixed at 130 nm; light wavelength was 650 nm.

As depicted in the graphs in FIGS. 6A, 6B, HCG layer 600 (shown in FIG. 6C) features two resonances for duty cycle values of 32 and 80% respectively, where the reflection peaks and the transmission drops while undergoing a phase jump. Between these two resonances, the transmission is high and the transmitted phase varies smoothly by an amount slightly over $1.6\pi$. Using data as shown by FIGS. 6A, and 6B an unpolarized transmissive HCG layer may be designed. More specifically, the dimensions of resonant elements in the HCG layer may be chosen such that the transmission characteristics of sub-patterns of the grating are encompassed between resonances in the transmission curves so that a HCG layer is insensitive to polarization of an incident wavefront. In the illustrated example, an unpolarized transmissive resonant optic element for 650 nm wavelength may designed based on an array of 130 nm tall silicon posts with a fixed pitch of 475 nm and post diameters varying between 140 nm and 380 nm.

It is noted that the feature aspect ratio of an HCG layer with transmission characteristics of sub-patterns of the grating encompassed between resonances in the transmission curves may be low as compared to HCG lens outside this regime as can be elucidated from the above example. The term "feature aspect ratio" refers to the ratio between the thickness of the pattern (e.g., thickness of posts or thicknesses $t_1$ or $t_2$ illustrated in FIG. 5) and the smallest dimension of the grating features (e.g. width of a ridge or post diameter).

Following the above procedures, an unpolarized HCG layer may be arranged to design a HCG lens to perform optical functions for controlling laser light impinging thereon such as focusing, collimating, or expanding a laser beam incident thereon. The basic principle is to choose the dimensions of the dimensions of resonant elements in the HCG layer such that the transmission characteristics of sub-patterns of the grating are encompassed between resonances in the transmission curves. Moreover, using such design approach, a HCG lens may be arranged with a high aspect ratio such as an aspect ratio below 10:1 or, more specifically, an aspect ratio below 5:1 or, even more specifically, an aspect ratio below 1:1. Thereby, it is facilitated a straightforward mass production of HCG layer using micro-fabrication processes such as deep-UV or nano-imprint lithography. It will be understood that the example illustrated in FIGS. 6A to 6C, in which a hexagonal post pattern is illustrated, may be generalized for a vast variety of HCG layer including different grating structures (e.g., line structures).

Some further examples of HCG layers with unpolarized resonant elements are illustrated the article titled "A Silicon Lens for Integrated Free-Space Optics," by Fattal et al. published in Integrated Photonics Research, Silicon and Nanophotonics, OSA Technical Digest (CD) (Optical Society of America, 2011), paper, which is incorporated herein by reference to the extent in which this document is not inconsistent with the present disclosure and in particular those parts thereof describing design of HCG lenses.

Figure 7:
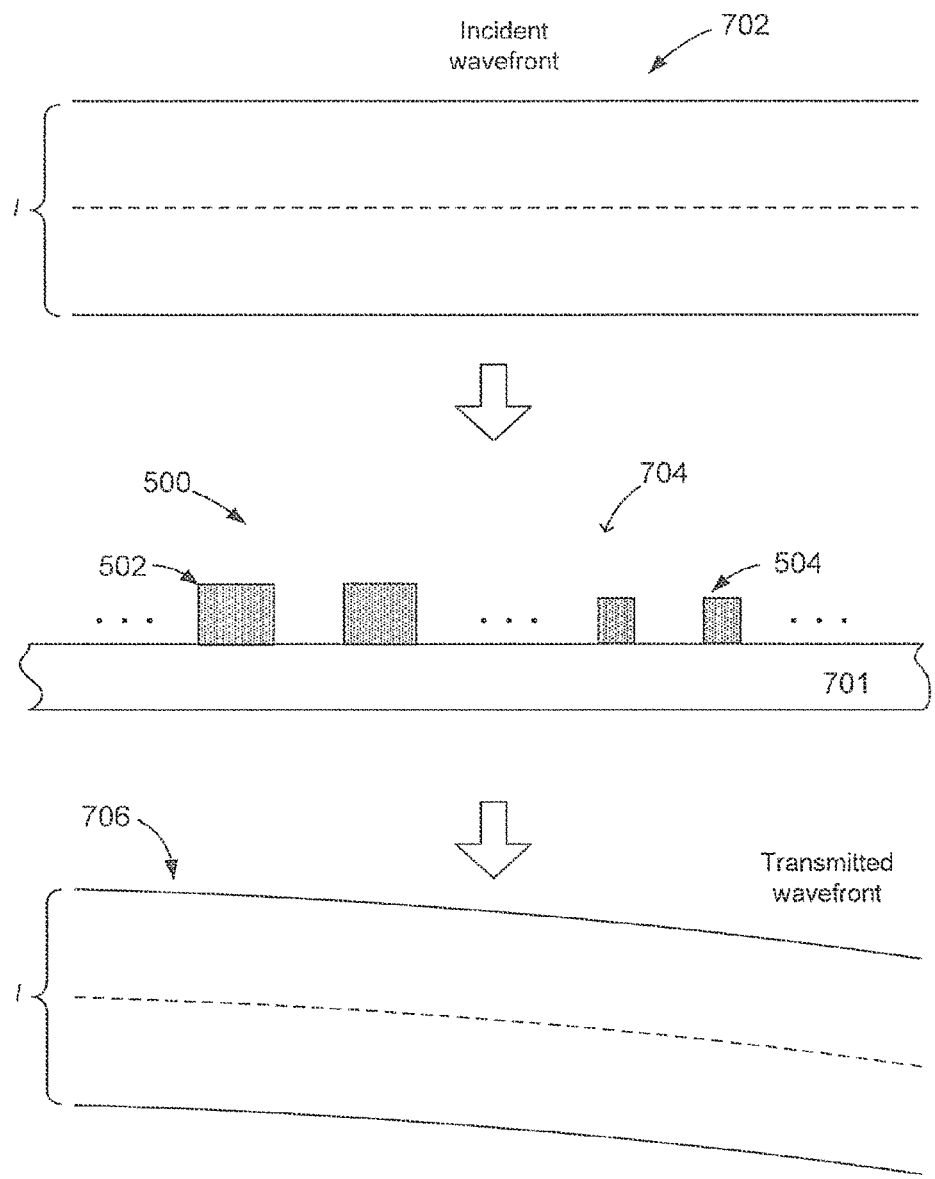
FIG. 7 is a schematic representation showing a cross-sectional view of a HCG lens according to examples.

FIG. 7 shows a cross sectional view of a HCG lens 704 in operation that illustrates how a transmitted wavefront may be changed according to an example. HCG lens 704 includes HCG layer 500. In this example HCG layer 500 is formed onto a transparent substrate 701. In other examples, the HCG layer may be formed onto a separation layer (e.g. separation layer 204 illustrated above).

In the example, incident light with a substantially uniform wavefront 702 impinges on HCG lens 704 producing transmitted light with a curved transmitted wavefront 706. Transmitted wavefront 706 results from portions of incident wavefront 702 interacting with sub-region 502 of HCG layer 500 with a relatively larger duty cycle $\eta_1$ and thickness $t_1$ than portions of incident wavefront 702 interacting with sub-region 504 of HCG layer 500 with a relatively smaller duty cycle $\eta_2$ and thickness $t_2$. The shape of the transmitted wavefront 706 is consistent with the larger phase acquired by light interacting with sub-region 502 relative to the smaller phase shift acquired by light interacting with the sub-region 504.

As apparent from FIG. 7, a HCG lens may be configured to provide arbitrary phase front shape modulation to laser light impinging thereon. Thereby, a HCG lens may be integrated in an optical device to facilitate optical coupling of a laser emitter/detector. For example, such HCG lenses might implement deflecting a laser beam, splitting a laser beam into different components, focusing or defocusing an incident laser beam, or collimating an incident laser beam.

Figure 8A:
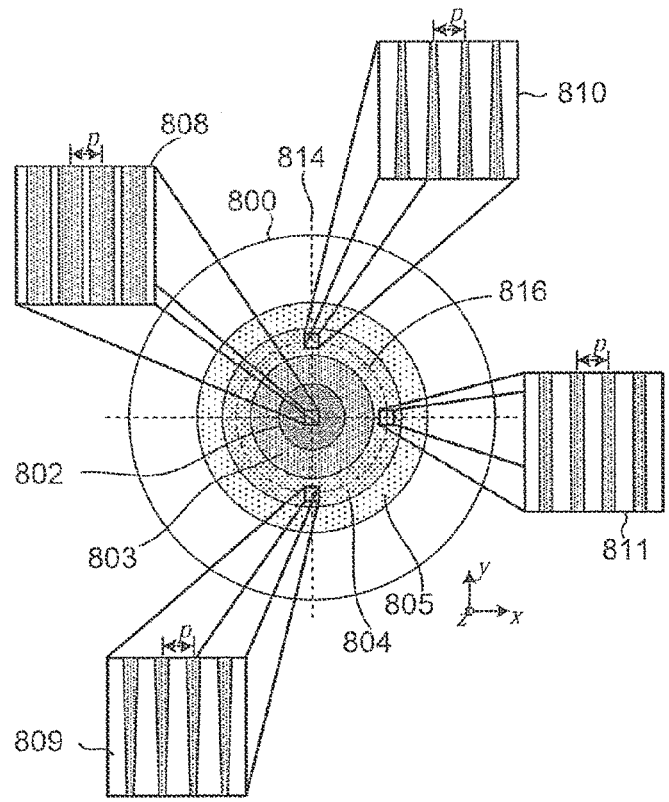
FIGS. 8A and 8B schematically show representations of a HCG lens according to examples.
Figure 8B:
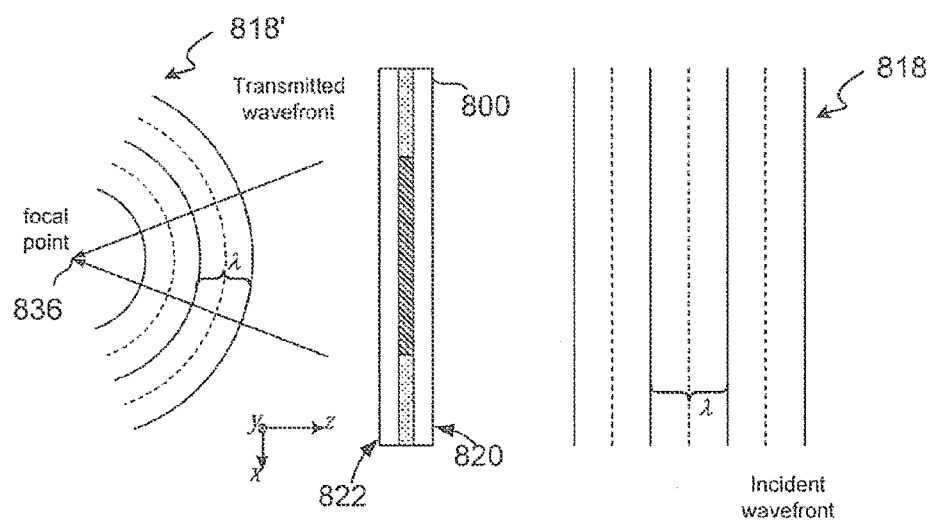

FIGS. 8A and 8B illustrate a specific example of a HCG lens 800 that can be operated as a convex lens for focusing incident light. FIG. 8A shows a top plan view of a one-dimensional grating pattern of a HCG lens 800 configured to be operated as a convex lens for focusing incident light into a focal point 836 by appropriately tapering the lines of the grating away from the center of HCG lens 800; FIG. 8B shows a cross-sectional view of HCG lens 800 in operation.

HCG lens 800 includes a non-periodical HCG with a grating pattern represented by annular shaded regions 802-805. Each shaded annular region represents a different grating sub-pattern of lines. Enlargements 808-811 show that the HCG includes lines tapered in the y-direction with a constant line period spacing p in the x-direction. More specifically, enlargements 808-811 are enlargements of the same lines running parallel to dashed-line 814 in the y-direction. Enlargements 808-810 reveal that the line period spacing p remains constant but the width of the lines narrow or taper away from the center of the HCG in the y-direction. Each annular region has the same duty cycle and period. For example, enlargements 808-811 reveal portions of annular region 804 including portions of different lines that have substantially the same duty cycle. As a result, each portion of an annular region produces the same approximate phase shift in the light transmitted through HCG lens 800. For example, dashed circle 816 represents a single phase shift contour in which light transmitted through the HCG lens anywhere along the circle 816 acquires substantially the same phase φ.

As depicted in FIG. 8B, the phase change causes a parallel wavefront 818, corresponding to a beam of light with wavelength λ directed normal to an input surface 820 of HCG lens 800, to be transmitted through an output surface 822 of HCG lens 822 as an output wavefront 818' converging towards focal point 836.

A HCG layer is not limited to the gratings structures illustrated above with respect to FIGS. 5 to 8B. A HCG layer can be configured with any suitable two-dimensional non-periodical grating so that the HCG lens can be operated to implement a specific laser beam control function such as focusing, expanding, collimating, mode-converting, tilting and/or an incident laser beam. In examples, a non-periodical HCG layer is composed of posts rather than lines, the posts being separated by grooves. The duty cycle and period can be varied in the x- and y-directions by varying the post size. In other examples, a non-periodical HCG lens is composed of holes separated by solid portions. The duty cycle and period can be varied in the x- and y-directions by varying the hole size. Such post or holes may be arranged according to a variety of shapes such as a circular or rectangular shape.

An HCG layer can be arranged to implement a particular optical function by appropriately designing a phase change induced to an incident wavefront. There is a number of ways for designing the induced phase change. In an example, for configuring the HCG layer, a transmission profile thereof may be determined using an appropriate computing tool, such as the application "MIT Electromagnetic Equation Propagation" ("MEEP") simulation package to model electromagnetic systems, or COMSOL Multiphysics® which is a finite element analysis and solver software package that can be used to simulate various physics and engineering applications. A determined transmission profile may be used to uniformly adjust geometric parameters of the entire HCG lens in order to produce a particular change in the transmitted wavefront.

Further specific examples of HCG lenses are illustrated in the article "A Silicon Lens for Integrated Free-Space Optics," by Fattal et al. published in Integrated Photonics Research, Silicon and Nanophotonics, OSA Technical Digest (CD) (Optical Society of America, 2011), and the international application with publication number WO 2011/093893, which documents are incorporated herein by reference to the extent in which this document are not inconsistent with the present disclosure and in particular those parts thereof describing designs of HCG lenses for transmission and refraction of light.

Figure 9:
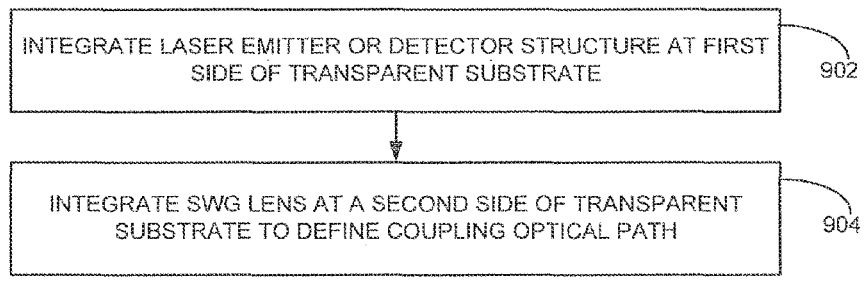
FIG. 9 schematically shows a flow chart that implements a method of manufacturing an optical device according to examples.

MANUFACTURING OF OPTICAL DEVICES: FIG. 9 shows a flow chart that implements a method of manufacturing an optical device according to examples.

At block 902, a laser emitter/detector structure is integrated at a first side of a transparent substrate. There are a variety of methods for integrating the laser emitter/detector structure at the substrate. In general, any suitable semiconductor fabrication process may be used for the laser emitter/detector integration such as, but not limited to, metal organic chemical vapor deposition (MOCVD), molecular beam epitaxy (MBE), etching, or a combination thereof.

At block 904, a HCG lens is integrated at a second side of the transparent substrate to define an optical path coupling the laser emitter/detector and the HCG lens via the transparent substrate. The HCG lens may be integrated on the substrate using a variety of micro-fabrication methods such as lithography, imprint processes, layer deposition, or a combination thereof.

HCG lenses may be designed with a HCG layer having a feature aspect ratio below 10:1 or, more specifically, an aspect ratio below 5:1 or, more specifically an aspect ratio below 1:1 following the procedure set forth above with respect to FIGS. 6A-6C. HCG lenses designed this way facilitate a convenient production thereof since higher feature aspect ratios render it difficult to use micro-fabrication techniques such as deep-UV or nano-imprint lithography.

In the following, the flow chart of FIG. 9 is illustrated with respect to FIGS. 10A to 10F. It will be understood that FIGS. 10A to 10F are merely illustrative and do not limit the example of FIG. 9. FIG. 10A to 10F shows fabrication of an optical device 1000.

Figure 10A:
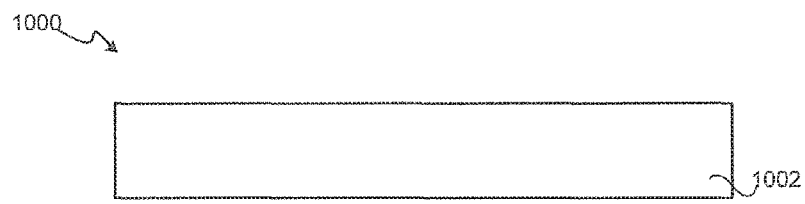
FIG. 10A to 10F schematically show manufacturing of an optical device according to examples.

In FIG. 10A, a transparent substrate 1002 is provided. Transparent substrate 1002 may be provided as a single piece or as multiple pieces fixed to each other (e.g., glued).

Figure 10B:
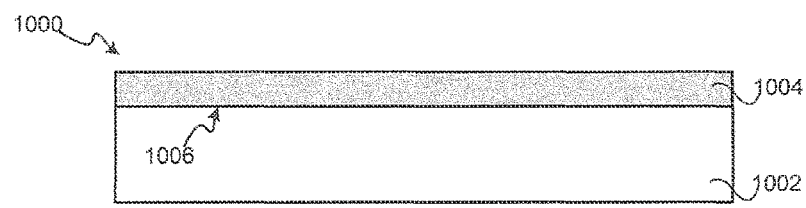

In FIG. 10B, grating material film 1004 is formed on a side 1006 of substrate 1002. Grating material film 1004 may be a dielectric film. Such a dielectric film can be formed on substrate 1002 by deposition, oxidation of an upper layer of substrate material (e.g., using thermal oxidation), sputtered, or by using chemical vapor deposition or other suitable technique. Grating material film 1004 may be formed from any one of a variety of materials, such as silicon ("Si"), gallium arsenide ("GaAs"), indium phosphide ("InP"), silicon carbide ("SiC"), or a combination thereof.

Figure 10C:
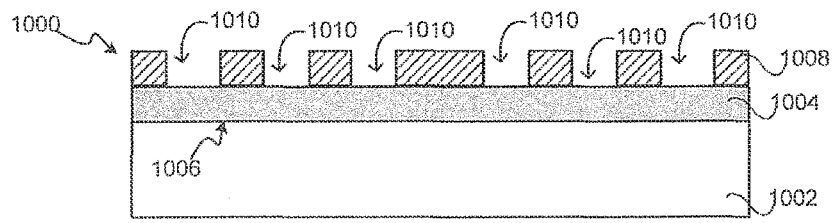

FIG. 10C illustrates an example diagram of structure 1000 including an additional mask film (e.g., a photoresist) 1008 patterned over grating material film 1004. Photoresist film 1008 may have a thickness of about 500 Å to about 5000 Å. However, it will be understood that the thickness thereof may vary depending on the specific application. For instance, the thickness of the photoresist film 1008 can vary in correspondence with the wavelength of radiation used for patterning this film. Photoresist film 1008 may be firstly applied over grating material film 1004 via spin-coating or spin casting deposition techniques and subsequently patterned to form a plurality of gaps 1010.

Gaps 1010 are to define a predetermined resonant pattern (e.g. a lined pattern or any of the patterns illustrated above) in the patterned photoresist film 1008. Patterned photoresist film 1008 can thus serve as an etch mask film for processing the underlying grating material layer 1004 and thereby form an HCG layer as shown in FIG. 10E.

Figure 10D:
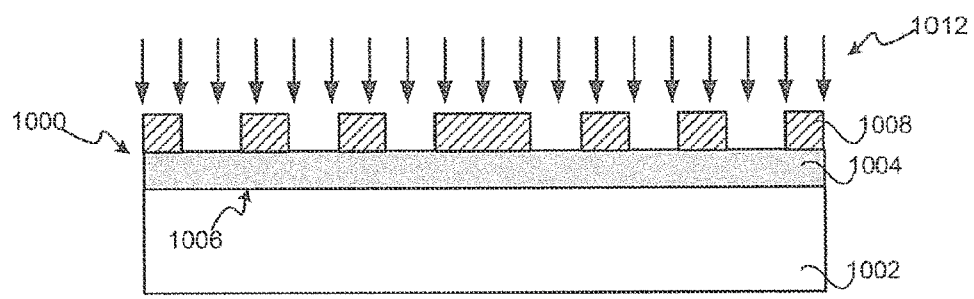
Figure 10E:
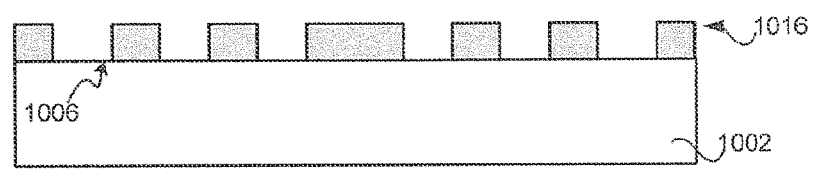
Figure 10F:
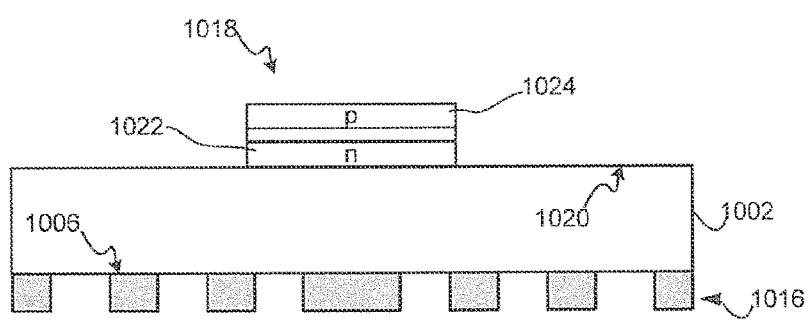

FIG. 10D illustrates an example diagram of structure 1000 undergoing etching of 1004 grating material film, as indicated by arrows 1012. The etching can be performed by plasma etching (e.g., an anisotropic deep reactive ion etching (DRIE) technique) or by any other suitable etch technique. For example, grating material film 1004 can be anisotropically etched with one or more plasma gases, such as carbon tetrafluoride ($CF_4$) containing fluorine ions, in a commercially available etcher, such as a parallel plate DRIE apparatus or, alternatively, an electron cyclotron resonance (ECR) plasma reactor to replicate the mask pattern of the patterned photoresist film. FIG. 10E shows the result of the etching in FIG. 10D, namely formation of an HCG layer 1016 onto substrate 1002. HCG layer 1016 constitutes a HCG lens.

As set forth above, a HCG lens may include a separation layer (e.g., separation layer 204 shown in FIG. 3). Such a separation layer may be implemented in the example of FIGS. 10A to 10F by forming it onto side 1006 of substrate 1002 previous to the formation of grating material film 1004.

Then, grating material film 1004 may formed on the separation layer and the steps in FIGS. 10B to 10E may be performed to fabricate a HCG layer thereon.

In the illustrated example of FIGS. 10A to 10F, once HCG layer 1016 is formed onto side 1006 of substrate 1002, a vertical-cavity laser diode 1018 may be formed onto an opposite side 1020 of substrate 1002. (It will be understood that laser diode 1018 may also be formed prior to formation of HCG layer 1016.) In the illustrated example, laser diode 1018 includes an n-type layer 1022 formed onto side 1020 of substrate 1002, an upper p-type layer 1024, and an inner cavity 1026 sandwiched therebetween. Upper p-type layer 1024 may be configured as a Bragg structure. Laser diode 1018 may include further layers and sub-layers not shown in FIG. 10F. In particular, n-type layer 1022, upper p-type layer 1024, and inner cavity 1026 may include sub-layers for implementing the functionality of the laser diode. The structure of laser-diode 1018 may be formed on substrate 1002 using a variety of semiconductor fabrication techniques such as epitaxial growth, chemical and physical deposition, oxidation, or ion implantation.

Formation of laser diode 1018 determines the emission/sensing characteristics thereof. In a specific example, laser diode 1018 is designed for emission/detection wavelengths in the 850 to 980 nm spectral range. In such example, substrate 1002 is chosen to be made of GaAs as being transparent to these emission wavelengths. Laser diode 1018 is an example of laser emitters/detectors referred herein. Generally, any suitable laser emitter/detector may be formed onto side 1020 of substrate 1002.

During fabrication, further components may be operatively coupled to optical device 1000. For example, if laser diode 1018 is constituted as a VCSEL, it might be coupled to a light modulator (e.g., light modulator 408 shown in FIG. 4) to cause emission of a modulated laser light via substrate 1002. The laser light is modulated for transmitting information encoded therein. If laser diode 1018 is constituted as a sensor, it might be coupled to a sensing system (e.g., sensing system 426 shown in FIG. 4) to detect laser light impinging on diode via substrate 1002. An output signal of the sensing system may be demodulated for decoding information encoded in the laser light.

Other components that may be coupled to optical device 1000 include the optical components set forth above with respect to FIGS. 3 and 4 such as an optical waveguide.

In the foregoing description, numerous details are set forth to provide an understanding of the examples disclosed herein. However, it will be understood that the examples may be practiced without these details. While a limited number of examples have been disclosed, numerous modifications and variations therefrom are contemplated. It is intended that the appended claims cover such modifications and variations. Further, flow charts herein illustrate specific block orders; however, it will be understood that the order of execution may differ from that which is depicted. For example, the order of execution of two or more blocks may be scrambled relative to the order shown. Also, two or more blocks shown in succession may be executed concurrently or with partial concurrence. Further, claims reciting "a" or "an" with respect to a particular element contemplate incorporation of one or more such elements, neither requiring nor excluding two or more such elements. Further, herein, at least the terms "include" and "comprise" are used as open-ended transitions.

What is claimed is:

1. An optical device, comprising:
    a transparent substrate;
    a laser emitter or a detector at a first side of the transparent substrate to emit or detect a laser light transmitted via the transparent substrate; and
    a high contrast grating HCG lens at a second side of the transparent substrate to transmit and refract the laser light, the HCG lens including a separation layer comprised of a low refractive index material built onto the substrate.

2. The device of claim 1, wherein, the HCG lens is to collimate a divergent laser light.

3. The device of claim 1, wherein, the HCG lens is to focus the laser light.

4. The device of claim 1, wherein, the HCG lens is to tilt the laser light.

5. The device of claim 1, wherein the HCG lens includes resonant structures configured to control laser transmission and refraction.

6. An optical communication device, comprising:
    a transparent substrate;
    a vertical-cavity surface emitting laser VCSEL integrated at a first side of the transparent substrate to emit a modulated laser light into the transparent substrate, the laser light being modulated for transmitting information;
    an optical waveguide to implement optical communications to a remote device via transmission of the modulated laser light; and
    a HCG lens integrated at a second side of the transparent substrate to:
        receive the modulated laser light from the transparent substrate, and
        transmit and refract the modulated laser light into an optical input of the optical waveguide;
    wherein the HCG lens includes a HCG layer and a separation layer interposed between the HCG layer and the substrate to enhance resonant optical effects that the HCG layer causes on the laser light impinging thereon.

7. The device of claim 6, wherein the VCSEL and the HCG conforms a sender, the remote device comprising a receiver including:
    another transparent substrate;
    a laser detector at a first side of the another transparent substrate;
    a HCG lens integrated at a second side of the transparent substrate to:
        receive the modulated laser light from the optical waveguide, and
        transmit and refract the modulated laser light from an optical output of the optical waveguide towards the laser detector via the another transparent substrate.

8. The device of claim 6, wherein the optical communication device forms part of a wavelength-division multiplexing WDM communication link.

9. The device of claim 6, further including an array of the VCSELs and an array of the HCG lens in a corresponding configuration for implementing an array of optical communication channels.

10. A method of manufacturing an optical device, the method comprising:
    integrating a laser emitter or detector at a first side of a transparent substrate;
    forming a separation layer on a second side of the transparent substrate, the separation layer being comprised of a low refractive index material;
    integrating a HCG lens on the separation layer at the second side of the transparent substrate to define an optical path coupling the laser emitter or detector and the HCG lens via the transparent substrate.

11. The method of claim 10, wherein a laser emitter is integrated at the transparent substrate forming a vertical-cavity surface-emitting laser (VCSEL).

12. The method of claim 10, wherein a detector is integrated at the transparent substrate to detect laser light coupled into the detector via the substrate and the HCG lens.

13. The method of claim 10, further comprising optically coupling an optical waveguide to the laser diode via the substrate and the HCG lens.

14. The device of claim 1, wherein the separation layer provides a refractive index difference between the HCG lens and the substrate to enhance resonant optical effects.

15. The device of claim 1, wherein the HCG lens receives the laser light from the transparent substrate, and transmits and refracts the modulated laser light into an optical input of an optical waveguide.

16. The device of claim 6, wherein, the HCG lens is to collimate a divergent laser light, focus the laser light, or tilt the laser light.

17. The method of claim 10, wherein the HCG lens includes resonant structures configured to control laser transmission and refraction.

* * * * *